United States Patent [19]

Deppe et al.

[11] Patent Number: 5,068,868
[45] Date of Patent: Nov. 26, 1991

[54] VERTICAL CAVITY SURFACE EMITTING LASERS WITH ELECTRICALLY CONDUCTING MIRRORS

[75] Inventors: Dennis G. Deppe, Austin, Tex.; Leonard C. Feldman, Berkeley Heights, N.J.; Rose F. Kopf, Bound Brook; Erdmann F. Schubert, New Providence, N.J.; Li Wei Tu, Westfield, N.J.; George J. Zydzik, Warren County, N.J.

[73] Assignee: AT&T Bell Laboratories, Murray Hill, N.J.

[21] Appl. No.: 526,204

[22] Filed: May 21, 1990

[51] Int. Cl.$^5$ ............................................. H01S 3/19
[52] U.S. Cl. ...................................... 372/45; 372/46; 357/4; 357/17
[58] Field of Search ................. 372/45, 46; 11/96, 43; 357/4, 17

[56] References Cited

U.S. PATENT DOCUMENTS 4,943,970 7/1990 Bradley ................................ 372/45
4,949,351 8/1990 Imanaka ............................... 372/45

OTHER PUBLICATIONS

Soda, et al., "GAInAsP/InP Surface Emitting Injection Lasers", *Jpn. J. Appl. Phys.*, vol. 18, No. 12, Aug. 1979.
Soda, et al., "GaInAsP/InP Surface Emitting Injection Lasers with Short Cavity Length", *IEEE J. of Quantum Electronics.*, vol. QE-19, No. 6, Jun. 1983.
Kinoshita, et al., "GaAlAs/GaAs Surface Emitting Laser with High Reflective TiO$_2$/SiO$_2$ Multilayer Bragg Reflector", Japanese Journal of Applied Physics, vol. 26, No. 3, Mar., 1987, pp. 410–415.
Zinkiewicz, et al., "High-power vertical-cavity surface emitting AlGaAs/GaAs diode lasers", *Appl. Phys. Lett.*, vol. 54(20), May 15, 1989.
Iga, et al., "Recent Advances of Surface Emitting Semiconductor Lasers", Optoelectronics-Devices & Technologies, vol. 3, No. 2, pp. 131-142, Dec. 1988.
Deppe, et al., "AlGaAs-GaAs and AlGaAs-GaAs-InGaAs vertical cavity surface emitting lasers with Ag mirrors", *J. Appl. Phys.*, vol. 66(11), Dec. 11, 1989.

*Primary Examiner*—Georgia Epps
*Attorney, Agent, or Firm*—Oleg E. Alber

[57] ABSTRACT

This invention is a semiconductor vertical cavity surface emitting laser comprising a lasing cavity with an active layer, a bottom (rear) mirror and a top (front) mirror, and a front and rear electrodes for applying excitation current in direction substantially parallel to the direction of optical propagation. In accordance with this invention the front mirror comprises a thin, semitransparent metal layer which also acts as the front electrode. The metal layer is upon a highly doped layer forming a non-alloyed ohmic contact. The metal is selected from Ag and Al and is deposited in thickness ranging from 5 to 55 nm. The VCSEL is a semiconductor device wherein the semiconductor material is a III-V or II-VI compound semiconductor. For a VCSEL with GaAs active layer, the light output from the front metal mirror/electrode side yields a high external differential quantum efficiency as high as 54 percent. This is the highest quantum efficiency obtained in VCSEL structures. Quantum efficiencies on the oder of 10 to 30 percent are typical for prior art VCSEL structures. The VCSEL is suitable for fabrication utilizing planar technology.

20 Claims, 5 Drawing Sheets

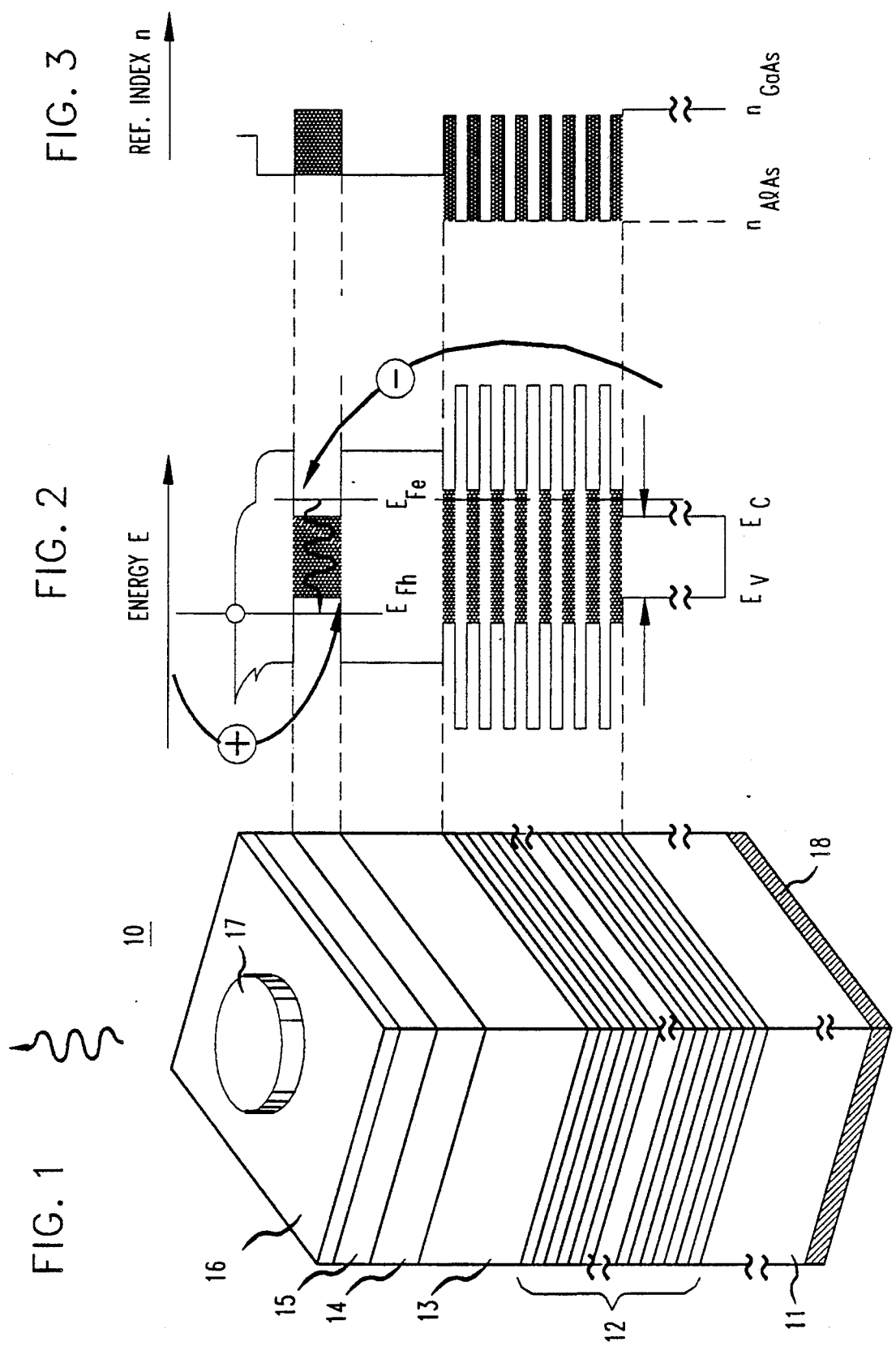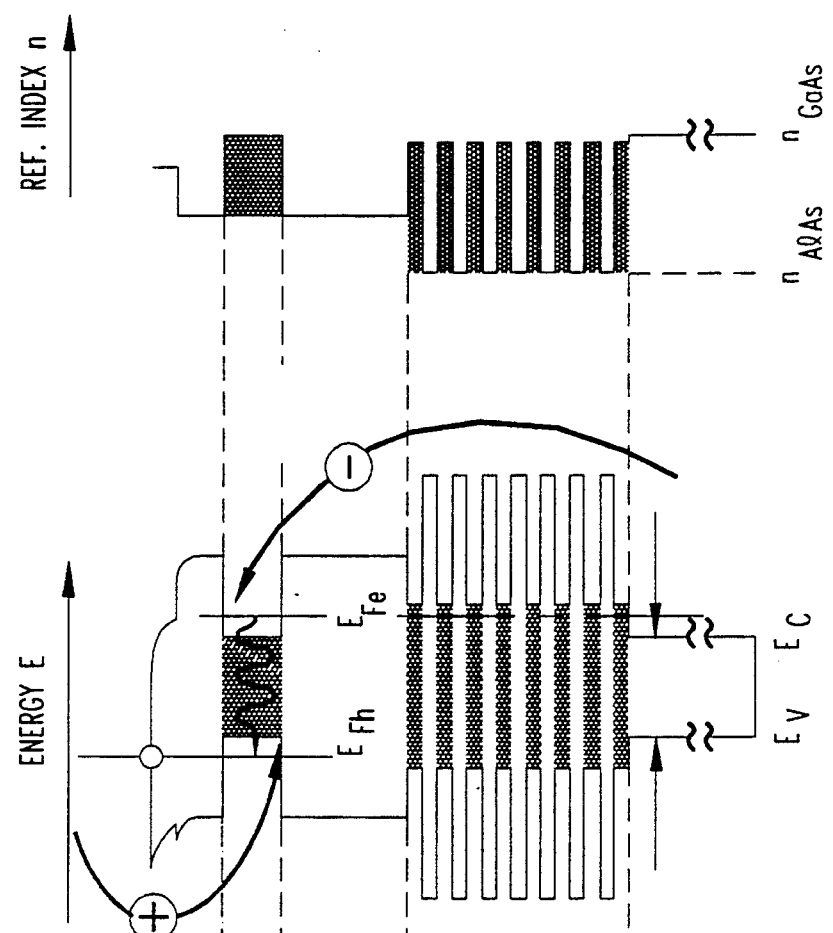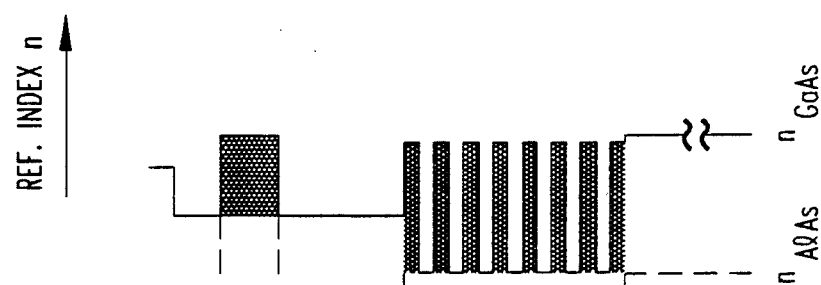

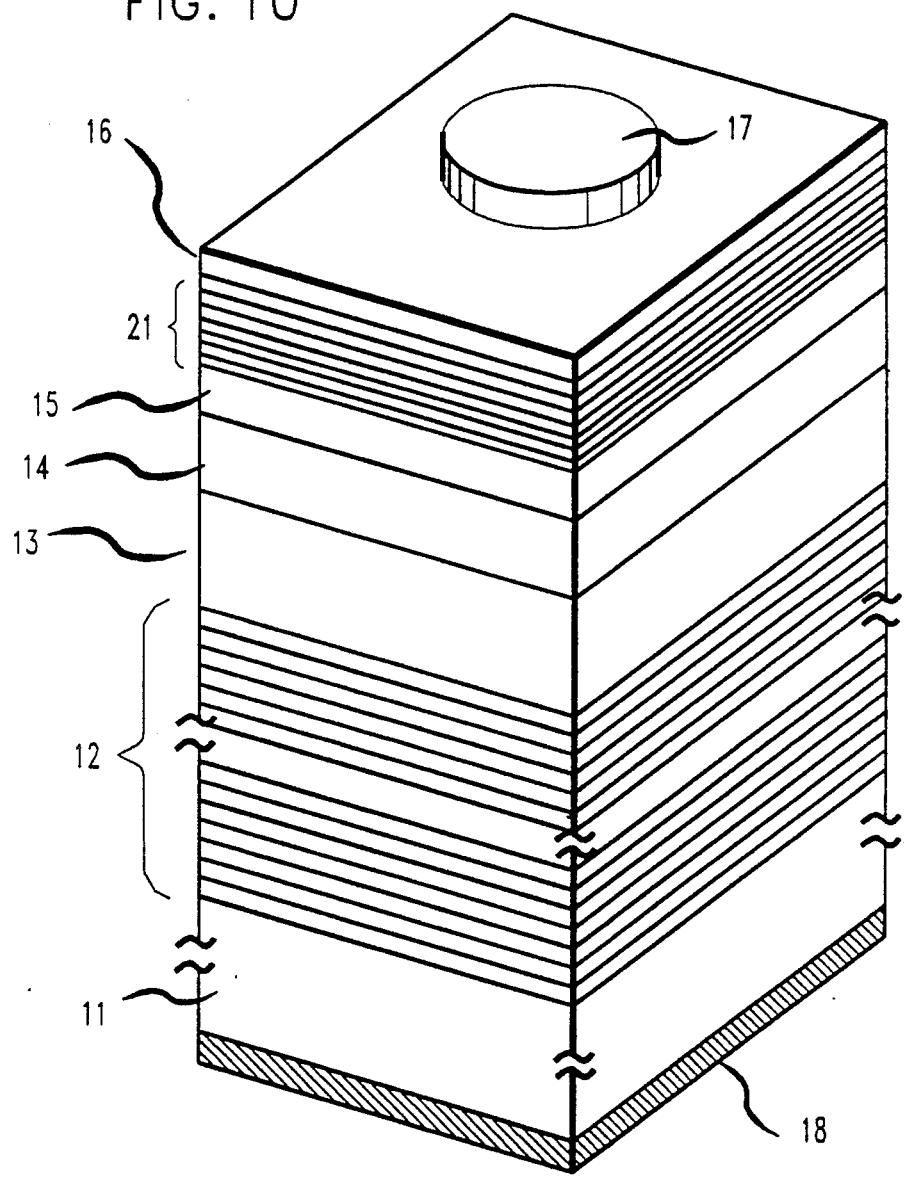

VERTICAL CAVITY SURFACE EMITTING LASERS WITH ELECTRICALLY CONDUCTING MIRRORS

FIELD OF THE INVENTION

This invention concerns Vertical Cavity Surface Emitting lasers having electrically conductive mirrors.

BACKGROUND OF THE INVENTION

A great effort is underway to integrate optical and electronic technology for optical fiber communication. An optical transmission system is generally made up of an optical source (e.g. a light-emitting diode or laser), an optical fiber and a detector. Small, efficient and reliable, the semiconductor laser has been accepted as a practical light source for the optical fiber communication.

Vertical Cavity Surface Emitting Laser diode, hereinafter referred to as a VCSEL, is attractive as a device which may be produced by planar technology and as a class of devices with a wide range of potential uses including optical communications, optical discs, laser printers and light sensing systems. In the VCSEL the lasing cavity is perpendicular to the top surface of a laser chip. Therefore, high packing density, compared to the packing density of edge-emitting lasers with lasing cavity parallel to the surface of the laser chip, is obtainable. This would lead to a promising future in high density laser arrays, high data transmission in optical communication systems, ultra high parallel processing in optical communication systems, as well as supplying a route for fast and vast data transmission between electronic chips. Furthermore, the circular-like nature of their beams makes them suited for beam-combining for high-power applications.

In the VCSEL the light output is in the film growth direction which is usually parallel to the direction of the injection current. Due to this feature, the mirror and electrical contact physically occupy the same side of the laser structure, i.e. either on the top (front) or on the bottom (rear) of the device. Typically, the mirror is located approximately in the center of the top surface while the electrode is located peripherally of the mirror. In some designs, the front mirror and the electrode are coplanar while in some others the planes are vertically offset each from another. An example of a coplanar arrangement may be found in articles by H. Soda et al., entitled "GaInAsP/InP Surface Emitting Injection Lasers," *Japanese Journal of Applied Physics*, Vol. 18, No. 12, 1979, pp. 2329-2230; and by H. Soda et al. entitled "GaInAsP/InP Surface Emitting Injection Lasers with Short Cavity Length," *IEEE Journal of Quantum Electronics*, Vol. QE-19, No. 6, June 1983, pp. 1035-1041. Each of these articles describes a surface emitting laser with a coplanar mirror/electrode arrangement and a Au mirror a few tenths of micrometer thick. However, S. Kinoshita pointed out that such mirrors lead to low quantum efficiency. See an article by Susumu Kinoshita et al. entitled "GaAlAs/GaAs Surface Emitting Laser with High Reflective $TiO_2$/$SiO_2$ Multilayer Bragg Reflector," *Japanese Journal of Applied Physics*, Vol. 26, No. 3, March 1987, pp. 410-415. This led to the development of laser structures utilizing multilayer (semiconductor or dielectric) mirrors. For example, see L. M. Zinkiewicz et al., "High Power Vertical-Cavity Surface-Emitting AlGaAs/GaAs Diode Lasers," *Appl. Phys. Letters*, Vol. 54, No. 20, May 15, 1989, pp. 1959-1961, and Kenichi Iga, "Recent Advances of Surface Emitting Semiconductor Lasers," *Optoelectronics-Devices and Technologies*, Vol. 3, No. 2, December 1988, pp. 131-142.

However, these structure are complicated and cumbersome. An attempt to simplify construction of a VCSEL by combining the mirror and the electrode into a single unit led to relatively low quantum efficiencies. The mirrors comprised an 0.55 μm thick reflective Ag mirror which also operated as the electrode of the laser. The emission took place through the λ/4 reflector stack consisting of 23 pairs of semiconductor layers, the semiconductors having different refractive indices within each pair. See Deppe D. G., et al., "AlGaAs-GaAs and AlGaAs-GaAs-InGaAs vertical cavity surface emitting lasers with Ag mirrors," *Journal of Applied Physics*, Vol. 66, No. 11, December 1989, pp. 5629-5631.

Therefore, there is still a need for a VCSEL with an improved quantum efficiency which could be also produced in a simplified manner utilizing planar technology.

SUMMARY OF THE INVENTION

This invention concerns a semiconductor vertical cavity surface emitting laser comprising a lasing cavity with an active layer, a bottom (rear) mirror and a top (front) mirror, and a front and rear electrode for applying excitation current in direction substantially parallel to the direction of optical propagation. In accordance with this invention the front mirror comprises a thin, semitransparent metal layer which also acts as the front electrode. The metal layer is upon a highly doped layer forming a non-alloyed ohmic contact. The metal is selected from, for example, Ag and Al and is deposited in thickness ranging from 5 to 55 nm. The VCSEL is a semiconductor device wherein the semiconductor material is a III-V or II-VI compound semiconductor such as GaAs, GaInAs, InP, InGaPAs and other related semiconductors. For a VCSEL with GaAs active layer, the light output from the front metal mirror/electrode side yields an external differential quantum efficiency as high as 54 percent. This is the highest quantum efficiency obtained in VCSEL structures. Quantum efficiencies on the order of 10 to 30 percent are typical for prior art VCSEL structures. The VCSEL is suitable for fabrication utilizing planar technology.

BRIEF DESCRIPTION OF THE DRAWINGS

FIG. 1 is a schematic representation of a VCSEL with a semitransparent front mirror/electrode.

FIG. 2 is a schematic representation of an energy band diagram for the laser of FIG. 1.

FIG. 3 is a schematic representation of the profile of the refractive index for the materials of the laser of FIG. 1.

FIG. 10 is a schematic representation of the VCSEL of FIG. 1 with an additional mirror stack interposed between the active region and the mirror/electrode.

DETAILED DESCRIPTION

Figure 4:
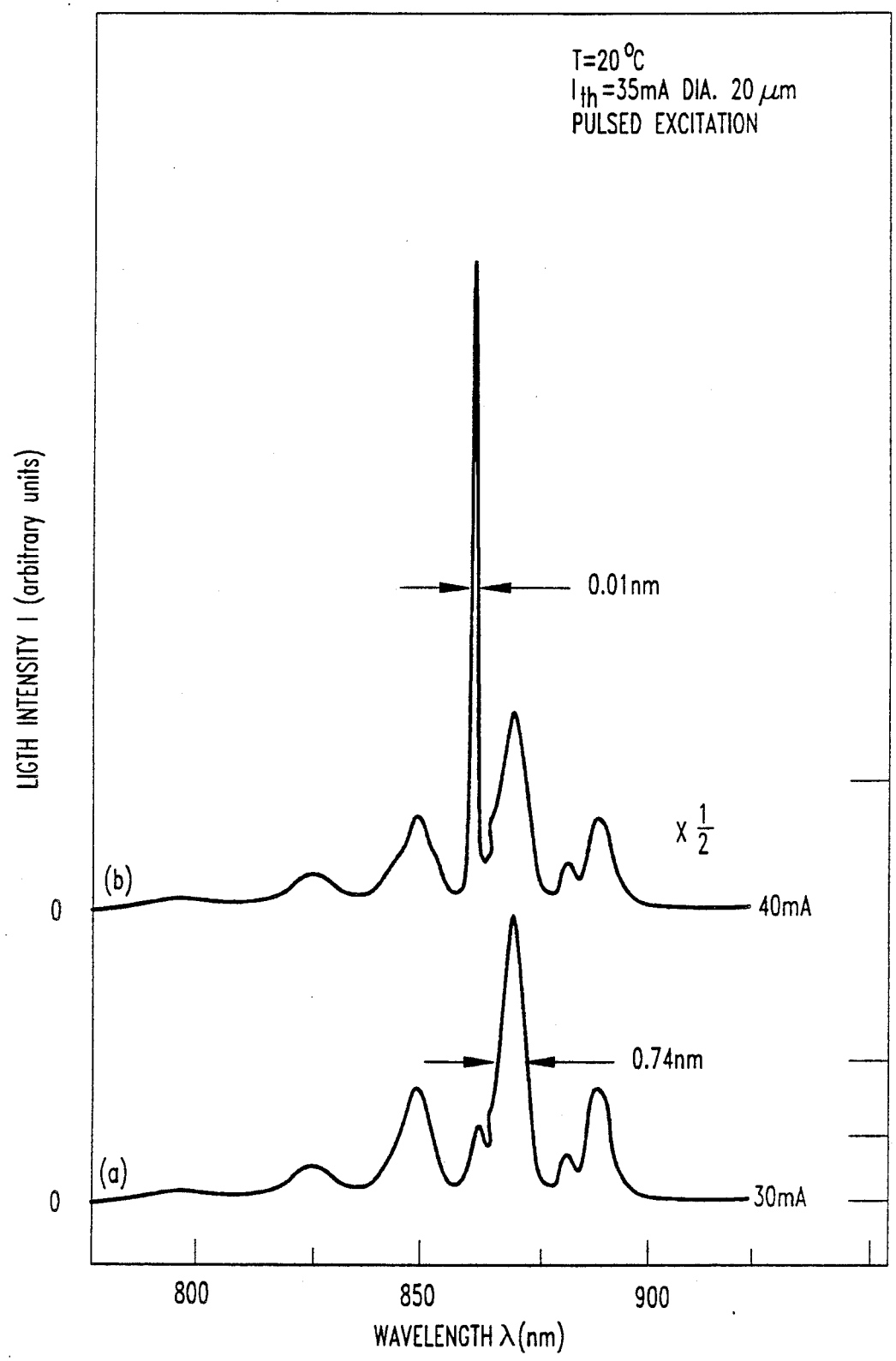
FIG. 4 is a schematic representation of electroluminescence spectra (EL) for a 20 μm 45 nm thick Ag dot (a) below and (b) above threshold of 35 mA, plotted as light intensity (I) versus wavelength λ.

The invention is a VCSEL in which the lasing cavity comprises an active layer, a bottom (rear) mirror consisting of a stack of a plurality of pairs of semiconductor layers forming quarter-wave multilayer distributed Bragg reflector (DBR) structure, and a top (front) metal mirror which is semi-transparent to lasing emission of the laser and which also acts as a top electrode with lasing emission taking place through the top mirror. The light output from the metal mirror/electrode yields a high differential quantum efficiency. This device may, conveniently, be produced by planar technology.

FIG. 1 is a general schematic representation of a VCSEL according to this invention, denominated generally as 10. VCSEL 10 comprises a substrate 11; a quarter-wave stack, 12, of a plurality of pairs of semiconductor layers, one layer of each pair having a refractive index different from the refractive index of another layer of the pair; a first confining layer, 13; an active layer, 14; a second confining layer, 15; a highly-doped contact layer, 16; a metal dot, 17, which acts simultaneously as a front mirror and as a non-alloyed ohmic top (front) electrode of the device, and an electrically conductive layer, 18, in contact with the bottom surface of substrate 11 forms the bottom (rear) electrode of the device. While not shown, additional confining and buffer layers may be included into the laser structure.

Construction of VCSEL 10, in accordance with the invention, may be described as being generally as follows:

Substrate 11 is a heavily doped n+-type III-V or II-VI semiconductor, such as GaAs, GaInAs, InP, InGaPAs, and other related group III-V or II-VI compound semiconductors. Typically, the thickness of the substrate ranges from 100 to 500 $\mu$m and the doping concentration of the substrate ranges from $1 \times 10^{17}$ to $1 \times 10^{19}$ cm$^{-3}$. In some applications, such as opto-electronic integrated circuitry, substrate 11 may be first grown on a master substrate of silicon, which is in common to a number of devices grown on the master substrate.

Quarterwave stack 12 is composed of a plurality of pairs (or periods) of semiconductor layers forming a rear (bottom) multilayer distributed Bragg reflector (DBR) mirror with a number of pairs typically ranging from 10 to 40. One semiconductor layer in each pair has a higher index of refraction than the other semiconductor layer of the pair. The thickness of each semiconductor in the pair equals $\lambda/4$, wherein $\lambda$ is the optical wavelength of the laser device. For a device with an active region lasing at $\lambda = 0.87$ $\mu$m, such as a GaAs laser, a quarterwave stack of pairs of such semiconductors as GaAs and AlAs with refractive indices of 3.64 and 2.97, respectively, will consist of 62 nm thick GaAs layer and 73 nm thick AlAs layer while a stack of AlAs and Al$_{0.05}$Ga$_{0.95}$As will consist of pairs of layers 73 nm and 60 nm thick each, respectively.

Typically, first confining layer 13 and second confining layer 15 are provided to confine active region 14 and to adjust the length (L) of an optical cavity (that is, the thickness of the active region). The optical cavity length should be $2L = N \cdot \lambda$, wherein N is an integer and $\lambda$ is an operating optical wavelength of the laser. Typically, the thickness of each confining layer ranges from 0 to 3 $\mu$m. To obtain constructive interference, the thickness of the confining layers should be a multiple of $\lambda/2$ or $\lambda/4$. In the preferred embodiment the confining regions are of Al$_x$Ga$_{1-x}$As, with x ranging from 0.1 to 0.4.

Active region 14 is a region in which electrons (−) and holes (+) recombine providing, under proper stimulation, a lasing emission. In the preferred embodiment, the active region is a lightly doped ($1 \times 10^{16}$–$5 \times 10^{17}$ cm$^{-3}$) layer of GaAs with a thickness within a range from 0.1 to 1 $\mu$m. The single layer may be replaced by a quantum well (QW) structure composed of a narrow gap semiconductor about 1 to 30 nm thick, confined by wide-gap semiconductor. Alternatively, the single layer forming the active region may be replaced by a superlattice structure which is a multiquantum well structure with very thin barriers.

Highly doped contacting layer 16 is provided in thickness of from 0.01 to 0.1 $\mu$m to facilitate establishing a non-alloyed ohmic contact between the second confining layer 15 and the mirror/electrode dot 17. Typically, the doping concentration in the contacting layer 16 ranges from $1 \times 10^{19}$ to $1 \times 10^{20}$ cm$^{-3}$.

Dot 17 is of a metal which acts simultaneously as a front mirror and as a front electrode with light emission taking place through the mirror/electrode. In accordance with this invention, the conductive material is selected from metals, such as Ag and Al, which when deposited in thickness ranging from 5 nm to 50 nm exhibit semi-transparent/semi-reflective properties with reflectivity (R) falling within a range of from 20 to 99 percent and transmissivity (T) within a range of from 80 to 1 percent. Mirror/electrode 17 is a non-alloyed ohmic contact. Such contacts are deposited by evaporation at temperatures ranging from 100° to 500° C., preferably from 100° to 250° C. Higher temperatures could result in undesirable alloying of the metal into the semiconductor leading to a rough interface morphology which degrades the reflection properties of the metal mirror/electrode.

Metal electrode 18 from 1 to 10 $\mu$m thick is formed on the bottom (rear) surface of substrate 11 to provide for current flow perpendicular through the active region to cause lasing emission. The laser may be mounted with electrode 18 in contact with a heat-sink plate, e.g. of copper or some other heat-conductive material which does not contaminate the materials of the laser.

To increase the efficiency of mirror performance, a quarter-wave stack, 21, (FIG. 10) from 2 to 20 pairs of high index/low index material layers similar to the pairs in rear mirror 12, but with p+-type doping ($1 \times 10^{18}$ to $5 \times 10^{19}$ cm$^{-3}$) may be interposed between confining layer 15 and highly doped contact layer 16. Stack 21, is interposed to increase the reflectivity of the top mirror, especially when the thickness of the metal layer is less than 20 nm.

Semiconductor layers 12 through 16 can be grown upon substrate 11 by such known methods as metal organic vapor phase epitaxy (MOVPE), also known as metal organic chemical vapor deposition (MOCVD), or by molecular beam epitaxy (MBE) or by hydride vapor phase epitaxy (VPE). In the preferred embodiment, the VCSEL structures are grown by Molecular Beam Epitaxy (MBE) technology in a Varian Gen II MBE system on heavily doped substrates 11. After layers 12 through 16 are grown, the partially formed structure is transferred to a separate high vacuum chamber where a metal layer is deposited as a non-alloyed ohmic contact in a thickness sufficient to provide desired reflectivity and transparency. Standard photolithographic techniques are then employed to define circular metal dots 17. Thin rear electrode layer 18, e.g., of In, may then be formed on the bottom surface of substrate 11. Finally, the rear side of the laser may be mounted via the In electrode or by means of a conductive adhesive, such as epoxy, on a copper slab which serves as a heat sink in common to other devices.

In the preferred embodiment, the VCSEL is an $Al_x$-$Ga_{1-x}As$/GaAs laser structure comprising in an ascending sequence 1 to 2 $\mu$m thick In electrode 18, about 500 $\mu$m thick (001) oriented heavily doped ($2 \times 10^{18}$ cm$^{-3}$) n+-GaAs substrate 11, rear mirror 12 consisting of a quarter-wave stack of 30 pairs of N+-type ($5 \times 10^{17} - 5 \times 10^{18}$ cm$^{-3}$) semiconductor layers forming multilayer distributed Bragg reflector (DBR) mirror, each pair of the stack consists of a 73 nm thick layer of n+-AlAs and 60 nm thick layer of $Al_{0.05}Ga_{0.95}As$. The reflectivity spectrum of the DBR structure (rear mirror 12), as measured with a Perkin-Elmer Lambda 9 UV/-VIS/NIR Spectrophotometer, showed a broad high reflectivity band centered at ~0.87 $\mu$m with a reflectivity >99 percent, which matches with a calculated reflectivity curve very well. The rear mirror is followed by first confinement layer 13 of n+-$Al_{0.20}Ga_{0.80}As$ ($5 \times 10^{17}$ cm$^{-3}$) about 3 $\mu$m thick, lightly doped ($5 \times 10^{16}$ cm$^{-3}$) active layer 14 of p−-GaAs about 0.6 $\mu$m thick, and second confinement layer 15 of p+-$Al_{0.30}Ga_{0.70}As$ ($5 \times 10^{16}$ cm$^{-3}$) about 0.5 $\mu$m thick. A thin, heavily doped ($5 \times 10^{19}$ cm$^{-3}$) contact layer of p+-$Al_{0.10}Ga_{0.90}As$, about 0.0625 $\mu$m thick is deposited on the very top of the layers for ohmic contact purpose. A dot 17 of silver (Ag) about 20 $\mu$m in diameter is formed on top of contact layer 16 in a thickness from about 5 to 50 nm, preferably 35 nm, under conditions leading to a non-alloyed ohmic contact. In this thickness range silver dot 17 is semi-transparent to the lasing emission enabling its use as a mirror and as a front electrode of the VCSEL. Silver is chosen as the metallic mirror/electrode because of its good conductivity and high reflectivity at wavelengths around 0.87 $\mu$m, which corresponds to the energy band gap of laser active material GaAs.

Transmission Electron Microscopy (TEM) study of the laser structures grown in a Varian Gen II molecular beam epitaxy (MBE) system disclosed the uniformity of the GaAs active region and the interface sharpness of the bottom mirror structure. X-ray $\theta/2\theta$ scans of Ag layers grown in a separate high vacuum chamber with various thicknesses from 20 to 200 nm deposited at 120° C., showed that the Ag films are polycrystalline. Standard photolithographic techniques were employed to define circular Ag dots 17 with diameters ranging from 5 to 100 micrometers. An etchant of 3HNO$_3$:4H$_2$O was used to etch away the unwanted Ag regions, which leaves a clean, smooth $Al_xGa_{1-x}As$ surface of contacting layer 16.

Lasers were electrically pumped using a fine probe, and the electroluminescence (EL) spectra were analyzed by a SPEX 1702/04 Spectrometer and a photomultiplier. Current-voltage characteristics were checked routinely with a Sony/Tektronix 370 Programmable Curce Tracer. The threshold voltage for the laser diode is close to the energy band gap of GaAs gain medium, which is 1.4 eV at room temperature. Above the threshold voltage, the current maintains a linear relation with the forward bias, indicating that the nonalloyed Ag contact is ohmic. All the measurements are done at room temperature, and no special cooling techniques are employed.

Figure 5:
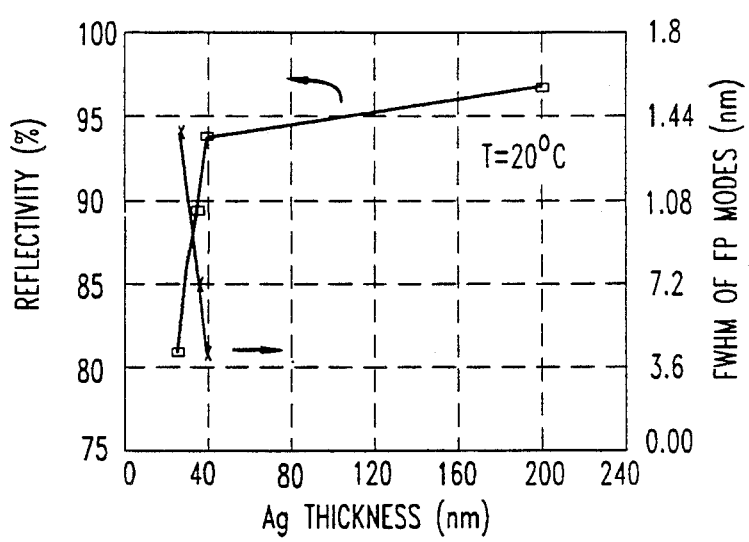
FIG. 5 is a plot of reflectivities (R) and Full Width at Half Maximum (FWHM) of Fabry-Perot (FP) Modes versus thickness of Ag mirrors.
Figure 6:
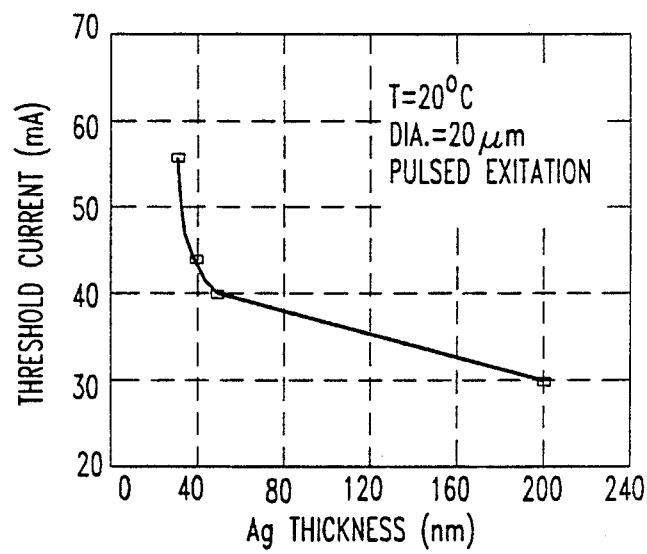
FIG. 6 is a plot of lasing threshold currents versus thickness of Ag mirrors 20 μm in diameter.

EL spectra of the VCSEL with a 20 $\mu$m diameter 35 nm thick Ag spot are shown in FIG. 4. Curve (a) of FIG. 4 is below lasing threshold of 35 mA. The spectrum is characterized by clear Fabry-Perot (FP) modes. The full width at half maximum (FWHM) of the FP modes is 0.74 nm. Curve (b) of FIG. 4 shows the lasing spectrum above threshold. The width of the lasing peak is less than 0.01 nm which is limited by the resolution of the spectrometer. The broad peaks which have the same peak-to-peak distance (~20.6 nm) as that of the much sharper FP modes are believed to be due to the spontaneous light emitted from the side of Ag spot. The FWHM of FM modes becomes larger for thinner Ag mirrors. From the finesses of the FP modes, reflectivities for Ag mirrors with different thicknesses are calculated (see FIG. 5), using known optical constants of Ag, air and $Al_{0.1}Ga_{0.9}As$. The reflectivity of the bottom mirror is chosen to be a unity in the calculations. See M. Born and E. Wolf, "Principles of Optics," 6th edition, Pergamon Press, New York, 1980, p. 628-631. The reflectivity decreases sharply when the Ag thickness is less than ~40 nm. From the FWHM of the broad peak, a reflectivity of ~40 percent is obtained, which is comparable to the reflectivity between GaAs and air. For 200 nm thick Ag mirrors, only broad peaks are seen, and no sharp FP modes are observed. The reflectivity at 200 nm Ag thickness shown in FIG. 5 is obtained from calculation using the optical data of Ag. Lasing threshold currents under pulsed operation versus the thicknesses of Ag mirrors are shown in FIG. 6. The diameter of the Ag mirrors is 20 $\mu$m. The lasing threshold current increases as the Ag mirror thickness decreases. This can be qualitatively explained by the decrease of the reflectivities with decreasing Ag thicknesses (see FIG. 5).

Figure 7:
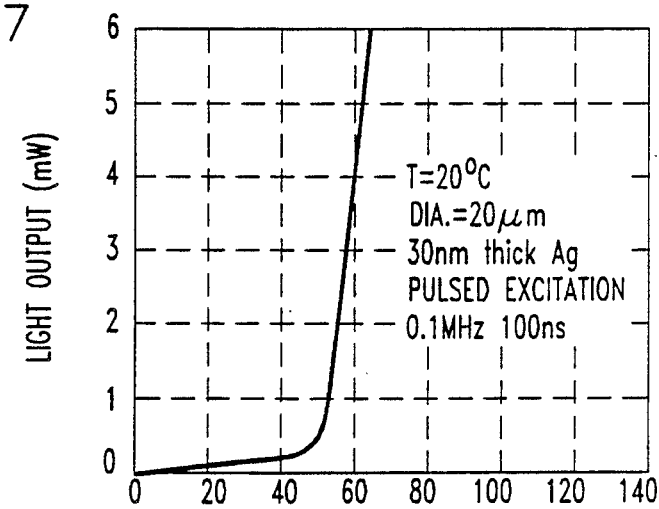
FIG. 7 is a plot of light output versus pumping current of a VCSEL with a Ag dot 20 μm in diameter and 30 nm thick with a duty cycle of 1% (0.1 MHz, 100 ns).
Figure 9:
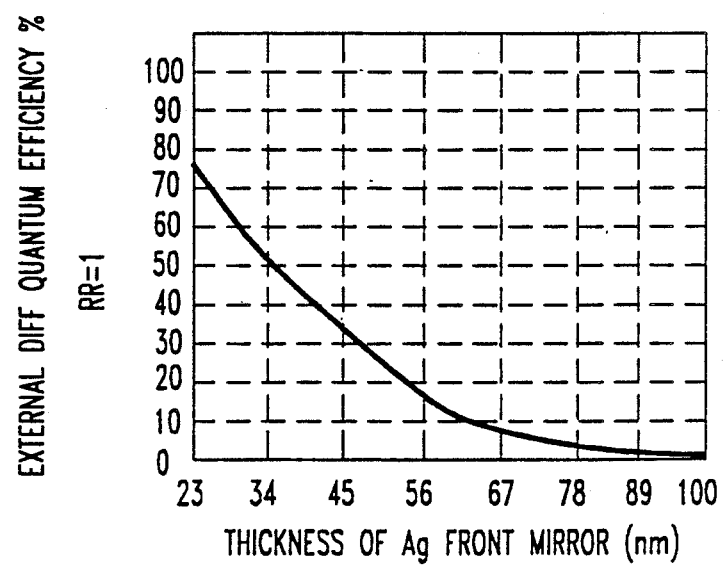
FIG. 9 is a plot of external differential quantum efficiency versus thickness of an Ag front mirror.

FIG. 7 shows the light output from the top Ag mirror versus excitation current. The light output is measured with ANDO AQ-1125 optical power meter calibrated around 0.85 $\mu$m. The Ag mirror has a diameter of 20 $\mu$m, and is 30 nm thick. Injection current pulses with one percent duty cycle (100 ns, 0.1 MHz) were applied to the laser diode. No power saturation was observed up to the maximum power of 11.5 mW. Large slope value of 0.76 mW/mA which yields an external differential quantum efficiency of 54 percent at lasing wavelength of 0.86 $\mu$m has been achieved. Quantum efficiencies for various Ag thicknesses ranging from 23 to 100 nm are shown in FIG. 9.

Figure 8:
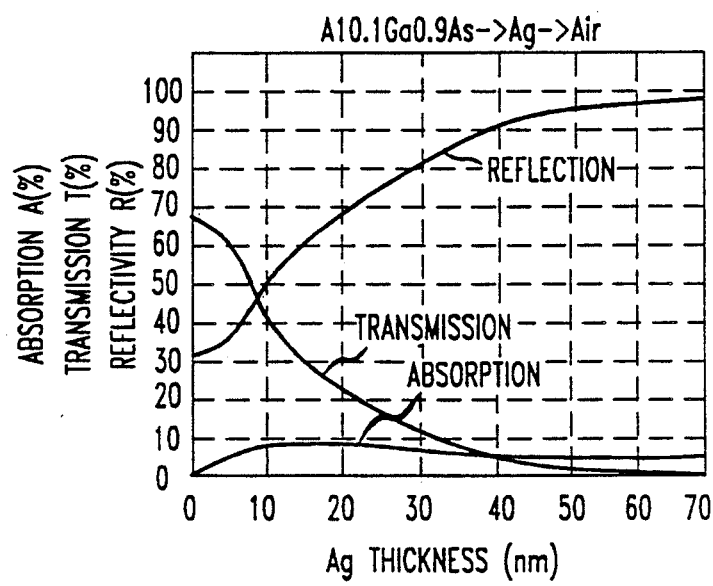
FIG. 8 is a plot of reflectivity, transmissivity and absorption versus Ag thickness.

FIG. 8 shows relation between reflection, transmission and absorption of Ag mirrors with Ag thicknesses up to 70 nm. The sum of these parameters always equals 100 percent. The three curves shown in FIG. 8 are calculated using the optical constants of Ag, air and $Al_{0.1}Ga_{0.9}As$ and the reflectivity of bottom (rear) mirror 12 as unity, see M. Born, et al., supra. Comparison of the absorption and the transmission curves shows that transmission is greater than absorption for thicknesses <50 nm. Only such thicknesses are useful for lasing emission through the top (front) Ag mirror.

We claim:

1. In a semiconductor vertical cavity surface emitting laser comprising at least one semiconductor selected from GaAs, GaAlAs, GaInAs, InP, InGaPAs and other related Group III-V and Group II-VI compound semiconductor, a plurality of layers including an active region which generates optical radiation and a rear mirror which reflects said radiation, said laser further comprises
a front mirror of a metal which forms a non-alloyed ohmic contact to the semiconductor body and serves simultaneously as a front electrode of the laser, and
a rear electrode for applying, in unity with the front mirror, excitation current in direction substantially perpendicular to the active region and substantially parallel to the direction of propagation of optical radiation,
wherein said front mirror comprises a layer of highly reflective metal deposited in a thickness permitting transmission of optical radiation through the front mirror in direction perpendicular to the active region, said metal layer consisting essentially of a metal selected from the group consisting of silver and aluminum and being from 5 to 50 nm thick.

2. The laser of claim 1, in which said semi-transparent metal layer comprises silver.

3. The laser of claim 2, in which said Ag layer is about 40 nm thick.

4. The laser of claim 1, in which said rear mirror is a multilayer distributed Bragg reflection mirror comprising from 10 to 40 pairs of quarter wave layers with different index of refraction.

5. The laser of claim 4, in which said active region comprises GaAs and said rear mirror comprises pairs of quarter wave layers selected from AlAs and GaAs and from AlAs and $Al_{0.05}Ga_{0.95}As$.

6. The laser of claim 1, in which a multilayer distributed Bragg reflection (DBR) structure comprising from 2 to 20 pairs of quarter wave layers with different index of refraction within each pair is interposed between the active region and the front mirror.

7. The laser of claim 6, in which said DBR structure comprises pairs of layers selected from AlAs and GaAs or from AlAs and $Al_{0.05}Ga_{0.95}As$.

8. The vertical cavity laser of claim 1 in which said semiconductor layers are grown on a semiconductor substrate by molecular beam epitaxy.

9. In a semiconductor vertical cavity surface emitting laser, wherein said semiconductor comprises at least one semiconductor selected from GaAs, GaAlAs, GaInAs, InP, InGaPAs and other related group III-V and II-VI compound semiconductors, a plurality of layers comprising in an ascending order from a semiconductor substrate
a multilayer distributed Bragg reflective (DBR) rear mirror upon the substrate,
an active region which generates an optical radiation, said active region being confined between a first and a second confining layers,
a highly doped contacting layer, and
a front mirror comprising a layer of a metal which forms a non-alloyed ohmic contact to said contacting layer and serves simultaneously as a front electrode of the laser, said metal layer being of highly reflective metal deposited in a thickness permitting transmission of said optical radiation through the front mirror in direction perpendicular to the active region, said metal layer consisting essentially of a metal selected from the group consisting of silver and aluminum and being from 5 to 50 nm thick.

10. The laser of claim 9, in which said metal is silver.

11. The laser of claim 9, in which said Ag layer is about 40 nm thick.

12. The laser of claim 9, in which said rear mirror is a multilayer distributed Bragg reflection mirror comprising from 10 to 40 pairs of quarter wave layers with different index of refraction in each pair.

13. The laser of claim 12, in which said active region is GaAs and said rear mirror comprises pairs of quarter wave layers selected from AlAs and GaAs and from AlAs and $Al_{0.05}Ga_{0.95}As$.

14. The laser of claim 9 in which a multilayer distributed Bragg reflection structure comprising from 2 to 20 pairs of quarter wave layers with different index of refraction is interposed between the active region and the front mirror.

15. The laser of claim 14, in which said DBR structure comprises pairs of layers selected from AlAs and GaAs and from AlAs and $Al_{0.05}Ga_{0.95}As$.

16. The laser of claim 9 in which said semiconductor layers are grown on a semiconductor substrate by molecular beam epitaxy.

17. In a semiconductor vertical cavity surface emitting laser, wherein said semiconductor comprises at least one semiconductor selected from GaAs, GaAlAs, GaInAs, InP, InGaPAs and other related group III-V and group II-VI compound semiconductors, a plurality of layers including an active region which generates optical radiation, a rear mirror which reflects said radiation, a front mirror which partially reflects and partially transmits said radiation in direction perpendicular to the active region, the front mirror being of a metal which forms a non-alloyed ohmic contact to the semiconductor body and serves simultaneously as a front electrode of the laser, and a rear electrode for applying in unity with the front mirror an excitation current in direction substantially perpendicular to the active region and substantially parallel to the direction of propagation of optical radiation,
in which said front mirror comprises a layer of highly reflective metal consisting essentially of a metal selected from the group consisting of silver and aluminum and being from 5 to 50 nm thick.

18. The laser of claim 17, in which said front mirror metal comprises silver.

19. The laser of claim 18, in which said Ag layer is about 40 nm thick.

20. The vertical cavity laser of claim 17 in which said semiconductor layers are grown on a semiconductor substrate by molecular beam epitaxy.

* * * * *